United States Patent
Johnson et al.

(10) Patent No.: US 9,447,489 B2
(45) Date of Patent: Sep. 20, 2016

(54) METHODS OF MAKING PHOTOVOLTAIC DEVICES AND PHOTOVOLTAIC DEVICES

(75) Inventors: James Neil Johnson, Scotia, NY (US); Bastiaan Arie Korevaar, Schenectady, NY (US); Yu Zhao, Niskayuna, NY (US)

(73) Assignee: First Solar, Inc., Tempe, AZ (US)

( * ) Notice: Subject to any disclaimer, the term of this patent is extended or adjusted under 35 U.S.C. 154(b) by 877 days.

(21) Appl. No.: 13/165,298

(22) Filed: Jun. 21, 2011

(65) Prior Publication Data

US 2012/0325298 A1    Dec. 27, 2012

(51) Int. Cl.

| | |
|---|---|
| *H01L 31/06* | (2012.01) |
| *C23C 14/06* | (2006.01) |
| *H01L 31/0296* | (2006.01) |
| *H01L 31/073* | (2012.01) |
| *H01L 31/0749* | (2012.01) |
| *C23C 14/54* | (2006.01) |
| *H01L 31/18* | (2006.01) |
| *C23C 18/12* | (2006.01) |

(52) U.S. Cl.
CPC ......... *C23C 14/0629* (2013.01); *C23C 14/548* (2013.01); *C23C 18/1204* (2013.01); *C23C 18/1279* (2013.01); *C23C 18/1291* (2013.01); *H01L 31/0296* (2013.01); *H01L 31/073* (2013.01); *H01L 31/0749* (2013.01); *H01L 31/1828* (2013.01); *H01L 31/1832* (2013.01); *Y02E 10/541* (2013.01); *Y02E 10/543* (2013.01); *Y02P 70/521* (2015.11)

(58) Field of Classification Search
CPC ........... H01L 31/073; H01L 31/03925; H01L 31/0296; H01L 31/0749; H01L 31/1828; H01L 31/1823
See application file for complete search history.

(56) References Cited

U.S. PATENT DOCUMENTS

| | | | |
|---|---|---|---|
| 4,677,250 A | 6/1987 | Barnett et al. | |
| 5,578,502 A * | 11/1996 | Albright | ......... H01L 31/022425 |
| | | | 257/E27.125 |
| 5,730,808 A | 3/1998 | Yang et al. | |

(Continued)

FOREIGN PATENT DOCUMENTS

| | | |
|---|---|---|
| CN | 102881735 A | 1/2013 |
| EP | 0006025 A1 | 12/1979 |

(Continued)

OTHER PUBLICATIONS

Emziane, et al "Effect of CdCl2 activation on the impurity distribution in CdTe/CdS soalr cell structures", Thin Solid Films, 2005, 377-381.*

(Continued)

*Primary Examiner* — Marla D McConnell
(74) *Attorney, Agent, or Firm* — MacMillan, Sobanski & Todd, LLC (57) ABSTRACT

One aspect of the present invention includes method of making a photovoltaic device. The method includes disposing an absorber layer on a window layer, wherein the absorber layer includes a first region and a second region. The method includes disposing the first region adjacent to the window layer in a first environment including oxygen at a first partial pressure; and disposing the second region on the first region in a second environment including oxygen at a second partial pressure, wherein the first partial pressure is greater than the second partial pressure. One aspect of the present invention includes a photovoltaic device.

14 Claims, 5 Drawing Sheets

(56) References Cited

U.S. PATENT DOCUMENTS

| | | |
|---|---|---|
| 7,736,940 B2 | 6/2010 | Basol |
| 2008/0090072 A1 | 4/2008 | Findikoglu |
| 2009/0078318 A1 | 3/2009 | Meyers et al. |
| 2012/0305064 A1 | 12/2012 | Johnson et al. |

FOREIGN PATENT DOCUMENTS

| | | |
|---|---|---|
| EP | 2530724 A2 | 12/2012 |
| WO | 2012118771 A2 | 9/2012 |

OTHER PUBLICATIONS

Boyle, et al "A study of impurities in some CdS/CdTe photovoltaic celss prepared by wet-chemical methods using secondary ion mass spectrometry and X-ray photoelectron spectroscopy", Journal of Materials Chemistry, 1999, 2879-2884.*

Rose et al., "The Role of Oxygen in CdS/CdTe Solar Cells Deposited by Close-Spaced Sublimation", 25th PVSC; May 13-17, 1996; Washington, D.C., pp. 777-780.

Ferekides et al., "High effciency CSS CdTe solar cells", Elsevier Science S.A., Thin Solid Films (2000), pp. 520-526.

Huang et al., "Preparation of microcrystalline silicon solar cells on microcrystalline silicon carbide window layers grown with HWCVD at low temperature", Journal of Non-Crystalline Solids, (2008) vol. 354 , pp. 2430-2434.

Emaizne et al., "Effect of $CdCl_2$ activation on the impurity distribution in CdTe/CdS solar cell structures", Thin Solid Films, 2005, vol. 480-481, pp. 377-381.

Halliday et al., "Effects of Impurities in CdTe/CdS Structures: Towards Enhanced Device Efficiencies", IEEE 4th World Conference on Photovoltaic Energy Conversion, 2006, pp. 408-411.

Rose et al.,"Fabrication Procedures and Process Sensitivies for CdS/CdTe Solar Cells", Progress in Photovoltaics: Research and Applications, 1999, vol. 7, pp. 331-340.

EP Extended Search Report, Application No. 12172391.0, dated Jul. 27, 2015.

Chinese Office Action, Application CN 201210206637.7, dated Sep. 18, 2015.

Emziane et al., "Efficiency improvement in thin-film solar cell devices with oxygen-containing absorber layer", Applied Physics Letters, 2005, vol. 87, pp. 261901-1-261901-2.

* cited by examiner

METHODS OF MAKING PHOTOVOLTAIC DEVICES AND PHOTOVOLTAIC DEVICES

BACKGROUND

The invention generally relates to photovoltaic devices and methods of making photovoltaic devices. More particularly, the invention relates to photovoltaic devices that include an absorber layer and methods of making photovoltaic devices that include an absorber layer.

Thin film solar cells or photovoltaic devices typically include a plurality of semiconductor layers disposed on a transparent substrate, wherein one layer serves as a window layer and a second layer serves as an absorber layer. The window layer allows the penetration of solar radiation to the absorber layer, where the optical energy is converted to usable electrical energy. Cadmium telluride/cadmium sulfide (CdTe/CdS) heterojunction-based photovoltaic cells are one such example of thin film solar cells. Cadmium telluride (CdTe)-based photovoltaic devices typically demonstrate relatively low power conversion efficiencies, which may be attributed to a relatively low open circuit voltage ($V_{oc}$) in relation to the band gap of the material, which is due, in part, to the low effective carrier concentration and short minority carrier lifetime in CdTe.

Improving minority carrier lifetimes in the absorber material may be desirable. Further, improved methods of depositing the CdTe layer on the CdS layer resulting in improved performance may be desirable.

BRIEF DESCRIPTION OF THE INVENTION

One embodiment is a method of making a photovoltaic device. The method includes disposing an absorber layer on a window layer, wherein the absorber layer includes a first region and a second region. The method includes disposing the first region adjacent to the window layer in a first environment including oxygen at a first partial pressure and disposing the second region on the first region in a second environment including oxygen at a second partial pressure, wherein the first partial pressure is greater than the second partial pressure.

One embodiment is a method of making a photovoltaic device. The method includes disposing an absorber layer on a window layer, wherein the absorber layer includes a first region and a second region. The method includes disposing the first region adjacent to the window layer in a first environment including oxygen and controlling a partial pressure of oxygen in the first environment at a first partial pressure. The method further includes changing the partial pressure of oxygen in the first environment to a second partial pressure to form a second environment and disposing the second region on the first region in the second environment, wherein the first partial pressure is greater than the second partial pressure.

One embodiment is a photovoltaic device. The photovoltaic device includes a window layer and an absorber layer disposed on the window layer. The absorber layer includes a first region disposed adjacent to the window layer, the first region including oxygen at a first concentration, and a second region disposed on the first region, the second region including oxygen at a second concentration. A ratio of the first concentration to the second concentration is greater than about 10.

DRAWINGS

These and other features, aspects, and advantages of the present invention will become better understood when the following detailed description is read with reference to the accompanying drawings, wherein.

DETAILED DESCRIPTION

CdTe deposition on CdS in the presence of oxygen may be desirable as oxygen at the CdTe/CdS interface may provide improved interface characteristics (smaller grain sizes and lower pinhole density) that may result in higher device efficiencies and enhanced device stability. However, typical methods used to deposit CdTe in the presence of oxygen throughout the growth process may adversely affect CdTe material utilization and throughput as deposition rates are typically significantly lower in the presence of oxygen.

As discussed in detail below, some of the embodiments of the invention include methods of making photovoltaic devices including an absorber layer disposed in the presence of oxygen. Further, some of the embodiments of the invention include methods of making photovoltaic devices including disposing an absorber layer on a window layer in a step-wise manner, wherein the absorber layer includes a first region and a second region. In one embodiment, the method includes disposing the first region adjacent to the window layer in a first environment including oxygen at a first partial pressure such that the first region (at the interface between the window and absorber layers) includes oxygen. Without being bound by any theory, it is believed that oxygen at the interface between the window and absorber layers (for example, CdS/CdTe) provides improved interface properties (for example, smaller grain sizes, lower pinhole density, or enhanced alloying among layer constituent elements), allowing for high minority carrier lifetimes at the interface in contact with the window layer.

The method further includes disposing a second region on the first region in a second environment including oxygen at a second partial pressure, such that a partial pressure of oxygen in the first environment is greater than a partial pressure of oxygen in the second environment. Further, in certain embodiments of the invention, the second environment is substantially free of oxygen and the second region of the absorber layer is substantially free of oxygen. Without being bound by any theory, it is believed that the method of depositing the absorber layer in a controlled step-wise manner allows for improved compositional and structural properties at the interface between the window and absorber layers. Further, in some embodiments the method advantageously allows for deposition of an absorber layer, wherein the bulk of the absorber layer is substantially free of oxygen. Without being bound by any theory, it is believed that oxygen in the bulk of the absorber layer may adversely affect the properties of the absorber layer (for example, CdTe).

Approximating language, as used herein throughout the specification and claims, may be applied to modify any quantitative representation that could permissibly vary without resulting in a change in the basic function to which it is related. Accordingly, a value modified by a term or terms, such as "about", is not limited to the precise value specified. In some instances, the approximating language may correspond to the precision of an instrument for measuring the value.

In the following specification and the claims, the singular forms "a", "an" and "the" include plural referents unless the context clearly dictates otherwise.

The terms "transparent region" and "transparent layer" as used herein, refer to a region or a layer that allows an average transmission of at least 80% of incident electromagnetic radiation having a wavelength in a range from about 300 nm to about 850 nm. As used herein, the term "disposed on" refers to layers disposed directly in contact with each other or indirectly by having intervening layers therebetween, unless otherwise specifically indicated. As used herein, the term "disposing on" refers to a step of disposing layers directly in contact with each other or indirectly by having intervening layers therebetween, unless otherwise specifically indicated.

Figure 1:
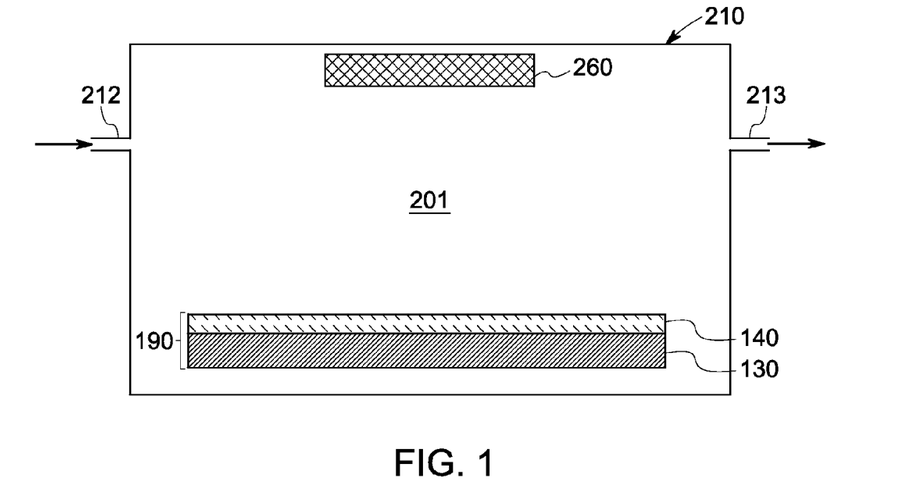
FIG. 1 is a schematic of a chamber for deposition of an absorber layer, according to one embodiment of the invention.

One embodiment includes a method of making a photovoltaic device. The method is described with reference to FIGS. 1-6. As indicated, for example, in FIGS. 1-6 the method includes disposing an absorber layer 160 on a window layer 130, wherein the absorber layer 160 includes a first region 140 and a second region 150. In one embodiment, as indicated in FIG. 1, the method includes disposing the first region 140 adjacent to the window layer 130 in a first environment 201 including oxygen at a first partial pressure.

Figure 2:
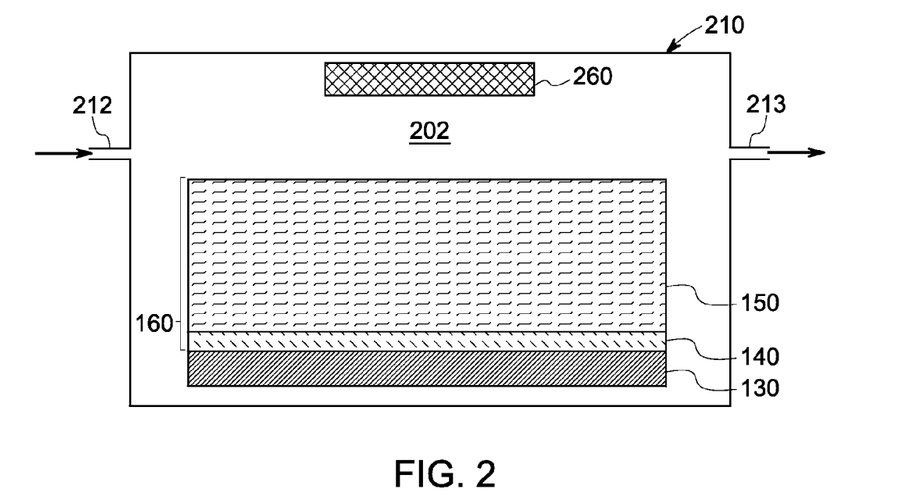
FIG. 2 is a schematic of a chamber for deposition of an absorber layer, according to one embodiment of the invention.
Figure 3:
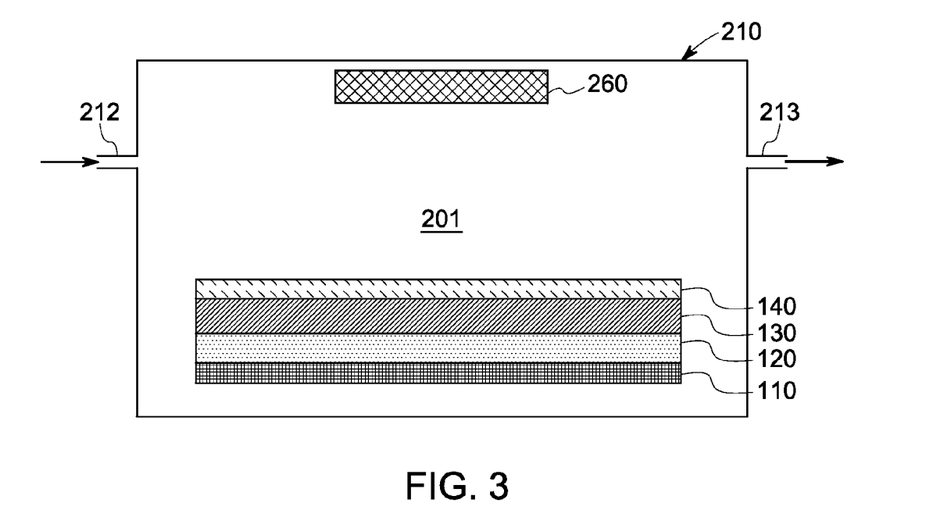
FIG. 3 is a schematic of a chamber for deposition of an absorber layer, according to one embodiment of the invention.
Figure 4:
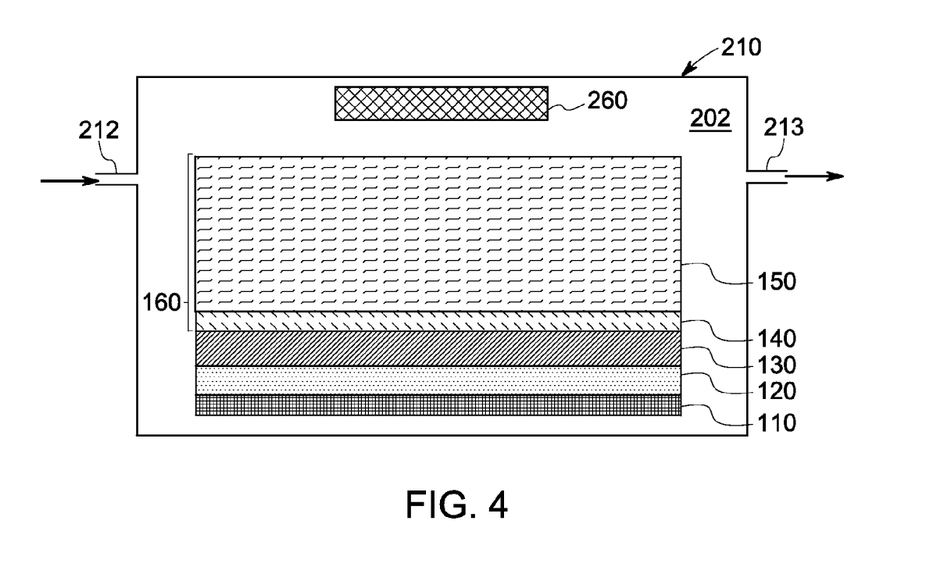
FIG. 4 is a schematic of a chamber for deposition of an absorber layer, according to one embodiment of the invention.

In one embodiment, as indicated in FIG. 2, the method further includes disposing the second region 150 on the first region 140 in a second environment 202 including oxygen at a second partial pressure, wherein the first partial pressure is greater than the second partial pressure. The term "adjacent" as used in this context means that the first region 140 is in direct contact with the window layer 130. The term "partial pressure" as used herein refers to the pressure that a gas (for example, oxygen) in a mixture of gases would exert if it alone occupied the whole volume occupied by the mixture. In embodiments where the first environment 201 solely contains oxygen, the term partial pressure refers to the pressure exerted by oxygen in the first environment 201.

The term "window layer" as used herein refers to a semiconducting layer that is substantially transparent and forms a heterojunction with the absorber layer 160. In some embodiments, the window layer 130 includes an n-type semiconductor material. In such embodiments, the absorber layer 160 may be doped to be p-type and the window layer 130 and the absorber layer 160 may form an "n-p" heterojunction. Non-limiting exemplary materials for the window layer 130 include cadmium sulfide (CdS), indium III sulfide ($In_2S_3$), zinc sulfide (ZnS), zinc telluride (ZnTe), zinc selenide (ZnSe), cadmium selenide (CdSe), oxygenated cadmium sulfide (CdS:O), copper oxide ($Cu_2O$), zinc oxihydrate (ZnO,H), or combinations thereof. In a particular embodiment, the window layer 130 includes CdS.

The term "absorber layer" as used in this context refers to a semiconducting layer wherein the solar radiation is absorbed. Typically, when solar radiation 10 is incident on the photovoltaic device 100, electrons in the absorber layer 160 are excited from a lower energy "ground state," in which they are bound to specific atoms in the solid, to a higher "excited state," in which they can move through the solid.

In one embodiment, the absorber layer 160 includes a p-type semiconductor material. In one embodiment, the absorber layer 160 has an effective carrier density in a range from about $1 \times 10^{13}$ per cubic centimeter to about $1 \times 10^{16}$ per cubic centimeter. As used in this context, the term "effective carrier density" refers to the average concentration of holes and/or electrons, as appropriate, in a material. In such instances, the window layer 130 may be doped to be n-type, and the absorber layer 160 and the window layer 130 may form a "p-n" or "n-p" junction, as mentioned above.

In one embodiment, a photoactive material is used for forming the absorber layer 160. Suitable photo-active materials include cadmium telluride (CdTe), cadmium zinc telluride (CdZnTe), cadmium magnesium telluride (CdMgTe), cadmium manganese telluride (CdMnTe), cadmium sulfur telluride (CdSTe), zinc telluride (ZnTe), copper indium sulphide (CIS), copper indium gallium selenide (CIGS), copper zinc tin sulphide (CZTS), or combinations thereof. The above-mentioned photo-active semiconductor materials may be used alone or in combination. Further, these materials may be present in more than one layer, each layer having different type of photo-active material or having combinations of the materials in separate layers. In one particular embodiment, the absorber layer 160 includes cadmium telluride (CdTe). In one particular embodiment, the absorber layer 160 includes p-type cadmium telluride (CdTe).

In some embodiments, the window layer 130 and the absorber layer 160 may be doped with a p-type dopant or an n-type dopant to form a heterojunction. As used in this context, a heterojunction is a semiconductor junction that is composed of layers of dissimilar semiconductor material. These materials usually have non-equal band gaps. As an example, a heterojunction can be formed by contact between a layer or region of one conductivity type with a layer or region of opposite conductivity, e.g., a "p-n" junction.

As noted earlier, the absorber layer 160 includes a first region 140 and a second region 150. In some embodiments, the first region 140 may function as an interfacial region between the window layer 130 and the second region 150. The composition of the first region 140 may provide for desirable interface properties between the window layer 130 and the absorber layer 160. Further, in some embodiments, the second region 150 of the absorber layer 160 may function as a bulk region of the absorber layer 160. As described herein, the terms "first region" and "interfacial region" are used interchangeably. Further, the terms "bulk region" and "second region" are used herein interchangeably.

Accordingly, in some embodiments, the first region 140 has a thickness less than a thickness of the second region 150. In some embodiments, the first region 140 has a thickness in a range from about 100 nanometers to about 1500 nanometers. In some embodiments, the first region 140 has a thickness in a range from about 100 nanometers to about 1000 nanometers. In particular embodiments, the first region 140 has a thickness in a range from about 100 nanometers to about 500 nanometers.

In some embodiments, the second region 150 has a thickness in a range from about 500 nanometers to about 3000 nanometers. In some embodiments, the second region 150 has a thickness in a range from about 750 nanometers to about 3000 nanometers. In particular embodiments, the second region 150 has a thickness in a range from about 1000 nanometers to about 3000 nanometers. In some embodiments, the absorber layer 160 has a thickness in a range from about 1000 nanometers to about 3000 nanometers. In particular embodiments, the absorber layer 160 has a thickness in a range from about 1000 nanometers to about 2000 nanometers.

In some embodiments, the absorber layer 160 may be deposited by close-space sublimation (CSS), vapor transport method (VTM), ion-assisted physical vapor deposition (IAPVD), radio frequency or pulsed magnetron sputtering (RFS or PMS), plasma enhanced chemical vapor deposition (PECVD), or electrochemical deposition (ECD). In particular embodiments, the absorber layer 160 may be deposited by close-space sublimation (CSS), diffused transport deposition (DTD), or vapor transport deposition (VTD).

In some embodiments, both the first region 140 and the second 150 of the absorber layer 160 may be deposited using the same deposition process. In some embodiments, both the first region 140 and the second region 150 of the absorber layer 160 are deposited by close-space sublimation (CSS), diffused transport deposition (DTD), or vapor transport deposition (VTD). In particular embodiments, both the first region 140 and the second 150 region of the absorber layer 160 are deposited by diffused transport deposition.

As noted earlier, in some embodiments, the method includes disposing the absorber layer 160 in a step-wise manner, wherein disposing the absorber layer 160 includes disposing the first region 140 adjacent to the window layer 130 in a first environment 201 and disposing a second region 150 on the first region 140 in a second environment 202. In some other embodiments, the method includes disposing the absorber layer 160 in a continuous manufacturing process.

Referring to FIG. 1, in some embodiments, the method includes disposing the first region 140 adjacent to the window layer 130 in a first deposition chamber 210. In certain embodiments, the method includes transferring the window layer 130 to the first deposition chamber 210 prior to the step of deposition of absorber layer 160 on the window layer 130. Further, it should be noted that in some embodiments, the window layer 130 is further disposed on a transparent layer 120, which is further disposed on a support 110, as described later. As indicated in FIG. 1, in some embodiments, the first deposition chamber 210 further includes at least one source 260 for the absorber layer 160. In some embodiments, the first deposition chamber 210 further includes at least one source 260 for cadmium telluride.

As noted earlier, in some embodiments, the first region 140 is deposited in a first environment 201 present in the first deposition chamber 210. In some embodiments, the first environment 201 includes oxygen and the first region 140 is deposited adjacent to the window layer 130 in the presence of oxygen. In some embodiments, the first deposition chamber 210 further includes at least one vent 212 for providing oxygen to the deposition chamber 210, as indicated in FIG. 1.

In some embodiments, the step of disposing the first region 140 adjacent to the window layer 130 includes controlling a partial pressure of oxygen in the first environment 201 at a first partial pressure. In some embodiments, controlling a partial pressure of oxygen in the first environment 201 at the first partial pressure includes continuously providing oxygen to the first environment 201 such that the desired partial pressure is maintained. In some embodiments, the method of disposing the absorber layer 160 includes disposing the first region 140 adjacent to the window layer 130 in the presence of a continuous flow of oxygen. In some embodiments, the first deposition chamber 210 includes a continuous flow of oxygen through the first deposition chamber, for example, via vents 212 and 213, as indicated in FIG. 1. This is in contrast to deposition process where the absorber layer 160 is deposited in a deposition chamber that includes a static supply of oxygen such that the oxygen content in the deposition chamber is not controlled.

In some embodiments, the first environment 201 further includes an inert gas. In some embodiments, the method includes continuously flowing a mixture of oxygen and inert gas through the first deposition chamber 210 to maintain the first environment 201. In some embodiments, the first deposition chamber 210 includes a mixture of oxygen and inert gas present in an amount sufficient to maintain the desired chamber pressure for deposition of the first region 140. In some embodiments, the first environment 201 includes a mixture of oxygen and argon. In some embodiments, the first environment 201 includes a mixture of oxygen and helium.

In some embodiments, the partial pressure of oxygen in the first environment 201 is maintained at a determined amount depending on one or more of the concentration of oxygen desired in the first region 140, the thickness of the first region 140, or the thickness of the absorber layer 160. In particular embodiments, the partial pressure of oxygen in the first environment 201 is substantially constant over the time period for deposition of the first region 140 on the window layer 130. The term "substantially constant" as used in this context means that the variation in the partial pressure of oxygen in the first environment 201 is less than about 10 percent over the deposition period for the first region 140. This is in contrast to deposition process where the absorber layer 160 is deposited in a deposition chamber that includes a static supply of oxygen such that the oxygen content in the deposition chamber reduces over the period of deposition.

In some embodiments, the partial pressure of oxygen in the first environment 201 is in a range greater than about 0.1 Torr. In some embodiments, the partial pressure of oxygen in the first environment 201 is in a range greater than about 0.5 Torr. In some embodiments, the partial pressure of oxygen in the first environment 201 is in a range greater than about 1 Torr. In some embodiments, the partial pressure of oxygen in the first environment 201 is in a range from about 0.1 Torr to about 10 Torr. In particular embodiments, the partial pressure of oxygen in the first environment 201 is in a range from about 0.1 Torr to about 1 Torr.

In some embodiments, the partial pressure of oxygen in the first environment 201 is controlled such that a concentration of oxygen in the first region 140 is in a range from about $1 \times 10^{17}$ cm$^{-3}$ to about $1 \times 10^{21}$ cm$^{-3}$. In some embodiments, the concentration of oxygen in the first region 140 is in a range from about $5 \times 10^{17}$ cm$^{-3}$ to about $5 \times 10^{20}$ cm$^{-3}$. In particular embodiments, the concentration of oxygen in the first region 140 is in a range from about $1 \times 10^{18}$ cm$^{-3}$ to about $1 \times 10^{20}$ cm$^{-3}$. The term "concentration" as used herein refers to the atomic concentration or the average number of atoms per unit volume of the oxygen present in the first region 140 or the second region 150. It should be noted that the term "concentration" in the first region 140 or the second region 150 refers to the average concentration across the thickness of the first region 140 or the second region 150. Further, the concentration of oxygen as described herein refers to the oxygen concentration in as-deposited first region 140 or second region 150 of the absorber layer 160, that is, the concentration prior to any subsequent post-deposition treatment, for example, cadmium chloride treatment.

In some embodiments, the method includes disposing the first region 140 on the window layer 130 in a graded manner, such that the concentration of the oxygen is compositionally graded across the thickness of the first region 140. In particular embodiments, the method includes disposing the first region 140 on the window layer 130, such that the concentration of the oxygen is substantially constant across the thickness of the first region 140. The term "substantially constant" as used in this context means that that the variation in the concentration of oxygen in the first region 140 is less than about 10 percent across the thickness of the first region 140. The term "compositionally graded" as used in this context means that a concentration of oxygen continuously changes across a thickness of the first region 140.

In some embodiments, the second region 150 is further disposed on the first region 140 in a second environment 202, as indicated in FIG. 2. In some embodiments, the second region 150 is disposed in the first deposition chamber 210 and the step of disposing the second region 150 includes changing the partial pressure of oxygen in the first environment 201 to a second partial pressure.

In some embodiments, the method includes changing the partial pressure of oxygen in the first deposition chamber 210 to a second partial pressure to create a second environment 202 before or during the step of disposing the second region 150. In some embodiments, the concentration of oxygen flowing through the first deposition chamber is reduced such that a lower amount of oxygen is incorporated in the second region 150 as compared to the first region 140.

In some embodiments, the partial pressure of oxygen in the second environment 202 is maintained at a determined amount depending on one or more of the concentration of oxygen desired in the second region 150, the thickness of the second region 150, or the thickness of the absorber layer 160. In some embodiments, the partial pressure of oxygen in the second environment 202 is substantially constant over the time period for deposition of the second region 150 on the window layer 130. The term "substantially constant" as used in this context means that the variation in the partial pressure of oxygen in the second environment 202 is less than about 10 percent over the deposition period for the first region 150. In some other embodiments, the partial pressure of oxygen in the second environment 202 continuously decreases over the deposition period of the second region 150. In some embodiments, the partial pressure of oxygen in the second environment 202 may be continuously varied by continuously reducing the flow of oxygen through the first deposition chamber 210.

In some embodiments, the partial pressure of oxygen in the second environment 202 is controlled to obtain a determined concentration of oxygen in the second region 150. In some embodiments, the partial pressure of oxygen in the second environment 202 is in a range less than about 0.1 Torr. In some embodiments, the partial pressure of oxygen in the second environment 202 is in a range less than about 0.05 Torr. In some embodiments, the partial pressure of oxygen in the second environment 202 is in a range less than about 0.01 Torr.

In some embodiments, the second environment 202 further includes an inert gas. In some embodiments, the method includes continuously flowing a mixture of oxygen and inert gas through the first deposition chamber 210 to maintain the second environment 202. In some embodiments, the first deposition chamber 210 includes a mixture of oxygen and inert gas present in an amount sufficient to maintain the desired chamber pressure for deposition of the second region 150. In some embodiments, the second environment 202 includes a mixture of oxygen and argon. In some embodiments, the second environment 202 includes a mixture of oxygen and helium. In particular embodiments, the second environment 202 is substantially free of oxygen. In some embodiments, the second environment includes an inert gas and the second region is deposited on the first region in the absence of oxygen.

In some embodiments, the method includes disposing a second region 150 on the first region 140 such that the second region 150 is substantially free of oxygen after the step of absorber layer deposition. The term "substantially free" as used in this context means that the concentration of oxygen in the second region 150 after the step of absorber layer deposition is less than about $1\times10^{18}$ cm$^{-3}$. In some embodiments, the concentration of oxygen in the second region 150 after the step of absorber layer deposition is less than about $1\times10^{16}$ cm$^{-3}$. In some embodiments, the concentration of oxygen in the second region 150 after the step of absorber layer deposition is less than about $1\times10^{15}$ cm$^{-3}$.

As noted earlier, the concentration of oxygen in the second region 150 is for an as-deposited absorber layer 160, that is, concentration in the absence of post-deposition processing. In some embodiments, as described later, the method further includes treating the deposited absorber layer with cadmium chloride ($CdCl_2$). In some embodiments, the concentration of oxygen in the absorber layer treated with $CdCl_2$ may be five times greater than the as-deposited absorber layer 160. In particular embodiments, the concentration of oxygen in the absorber layer treated with $CdCl_2$ may be greater than the as-deposited absorber layer by at least an order of magnitude, that is, ten times greater.

In some embodiments, the method includes turning off the flow of oxygen to the first environment 201 of the deposition chamber 210 prior to the step of disposing the second region 150. As described earlier, in such embodiments, the second region 150 is disposed in a second environment 202 that is substantially free of oxygen.

In some other embodiments, for example, in a continuous manufacturing process, the method includes forming a partial absorber layer 190 after the step of disposing the first region 140 adjacent to the window layer 130, as indicated in FIG. 1. The method further includes transferring the partial absorber layer 190 to a second deposition chamber that is different from the first deposition chamber (not shown). In such embodiments, the second deposition chamber includes a second environment 202 including oxygen at the second partial pressure. The method further includes disposing the second region 150 on the first region 140 in the second environment 202 of the second deposition chamber. In some embodiments, the method includes continuously depositing the absorber layer 160 in a deposition chamber such that the oxygen is injected from one side, wherein the oxygen partial pressure is higher at the entry level of the window layer 130 and lower at the exit level of the window layer 130.

Some embodiments include a method of making a photovoltaic device. The method includes disposing an absorber layer 160 on a window layer 130, as indicated in FIGS. 1-2. The absorber layer 160 includes a first region 140 and a second region 150. The method includes disposing the first region 140 adjacent to the window layer 130 in a first environment 201 including oxygen, as indicated in FIG. 1. The method includes controlling a partial pressure of oxygen in the first environment 201 at a first partial pressure. The method further includes changing the partial pressure of oxygen in the first environment 201 to a second partial pressure to form a second environment 202 and disposing the second region 150 on the first region 140 in the second environment 202, as indicated in FIG. 2. In some embodiments, the first partial pressure is greater than the second partial pressure. In some embodiments, the second environment is substantially free of oxygen. In some embodiments, changing the partial pressure of oxygen in the first environment 201 includes stopping the flow of oxygen.

Without being bound by any theory, it is believed that the method of the present invention advantageously allows for creation of a controlled concentration of oxygen at the interface between the window and absorber layers. Further, in some embodiments, the method advantageously allows for deposition of an absorber layer 160, wherein the bulk of the absorber layer 150 is substantially free of oxygen. As noted earlier, oxygen in the bulk of the absorber layer may adversely affect the properties of the absorber layer (for example, CdTe) 160.

Figure 9:
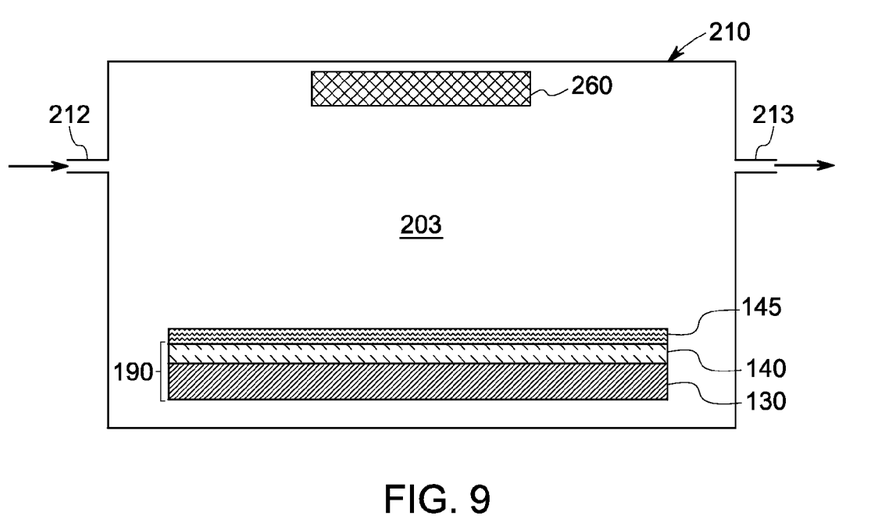
FIG. 9 is a schematic of a chamber for deposition of an absorber layer, according to one embodiment of the invention.

In some embodiments, the method further includes interposing a transition region 145 between the first region 140 and the second region 150 in a third environment 203, wherein the third environment includes oxygen at a third partial pressure, as indicated in FIG. 9. In some embodiments, the third partial pressure is lower than the first partial pressure and greater than the second partial pressure. In some embodiments, the method includes reducing a flow of oxygen to the deposition chamber 210 to a third partial pressure, after the step of disposing the first region 140.

In some embodiments, the partial pressure of oxygen in the third environment 203 is substantially constant over the time period for deposition of the transition region 145 on the first region 140. In some other embodiments, the partial pressure of oxygen in the third environment 203 continuously decreases over the deposition period of the transition region 145. In some embodiments, the partial pressure of oxygen in the third environment 203 may be continuously varied by continuously reducing the flow of oxygen through the first deposition chamber 210.

In some embodiments, the partial pressure of oxygen in the third environment is controlled such that a transition region 145 with the desired oxygen concentration profile is interposed between the first region 140 and the second region 150. In some embodiments, the concentration of oxygen in the transition region 145 is lower than the first region 140 and greater than the second region 150.

In some embodiments, the method includes disposing the transition region 145 on the first region 140, such that the concentration of the oxygen is substantially constant across the thickness of the transition region 145. In particular embodiments, the method includes disposing the transition region 145 on the first region 140 in a graded manner, such that the concentration of the oxygen is compositionally graded across the thickness of the transition region 145. In some embodiments, the composition of oxygen in the transition continuously decreases from the first region 140 to the second region 150. The term "substantially constant" as used in this context means that that the variation in the concentration of oxygen in the transition region 145 is less than about 10 percent across the thickness of the transition region 145. The term "compositionally graded" as used in this context means that a concentration of oxygen continuously changes across a thickness of the transition region 145.

In some embodiments, the method includes interposing a plurality of transition regions 145 between the first region 140 and the second region 150. In some embodiments, the plurality of transition regions 145 include a gradient in oxygen concentration such that the oxygen concentration continuously decreases from the first region 140 to the second region 150. As noted earlier, the method further includes disposing a second region 150 on the transition region 145, in such embodiments.

In one embodiment, after the step of disposing the second region 150 to form the absorber layer 160, the absorber layer 160 may be further treated with cadmium chloride ($CdCl_2$). In one embodiment, the absorber layer 160 may be treated with a solution of $CdCl_2$. In another embodiment, the absorber layer 160 may be treated with $CdCl_2$ vapor. The treatment with $CdCl_2$ is known to increase the carrier lifetime of the absorber layer 160. The treatment with cadmium chloride may be followed by an etching or rinsing step. In one embodiment, etching may be carried out using a suitable acid. In other embodiments, the $CdCl_2$ may be rinsed off the surface, resulting in a stoichiometric cadmium telluride at the interface, mainly removing the cadmium oxide and $CdCl_2$ residue from the surface, leaving a cadmium-to-tellurium ratio of about 1 at the surface. The etching works by removing non-stoichiometric material that forms at the surface during processing. Alternatively, other etching techniques known in the art that may result in a stoichiometric cadmium telluride at the back interface may be employed.

In some embodiments, as indicated in FIGS. 3-6, the method further includes disposing the window layer 130 on a transparent layer 120 before disposing the absorber layer 160 on the window layer 130. In some embodiments, the method further includes disposing the transparent layer 120 on a support 110 before disposing the window layer 130 on the transparent layer 120.

Figure 5:
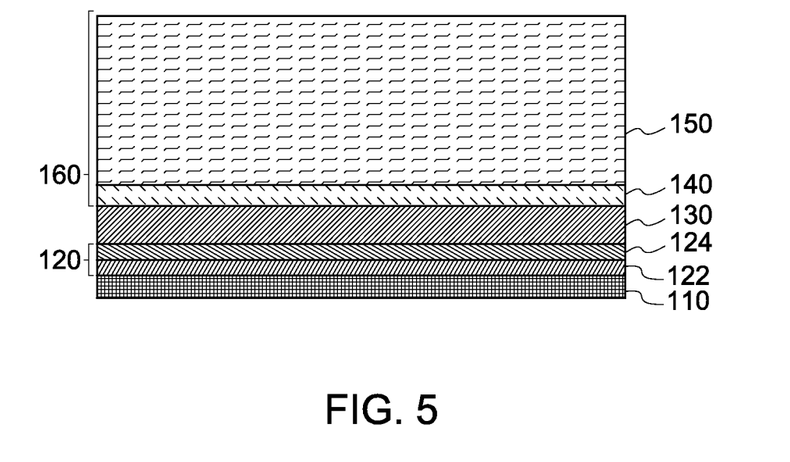
FIG. 5 is a schematic of a photovoltaic device, according to one embodiment of the invention.

In one embodiment, the transparent layer 120 includes an electrically conductive layer (sometimes referred to in the art as a front contact layer) 122 disposed on the support 110, as indicated in FIG. 5. In some embodiments, the window layer 130 is disposed directly on the electrically conductive layer 122. In an alternate embodiment, the transparent layer 120 includes an electrically conductive layer 122 disposed on the support 110 and an additional buffer layer 124 is interposed between the electrically conductive layer 122 and the window layer 130, as indicated in FIG. 5. In one embodiment, the transparent layer 120 has a thickness in a range from about 100 nanometers to about 600 nanometers.

In one embodiment, the electrically conductive layer 122 includes a transparent conductive oxide (TCO). Non-limiting examples of transparent conductive oxides include cadmium tin oxide (CTO), indium tin oxide (ITO), fluorine-doped tin oxide (SnO:F or FTO), indium-doped cadmium-oxide, cadmium stannate ($Cd_2SnO_4$ or CTO), doped zinc oxide (ZnO), such as aluminum-doped zinc-oxide (ZnO:Al or AZO), indium-zinc oxide (IZO), and zinc tin oxide ($ZnSnO_x$), or combinations thereof. Depending on the specific TCO employed and on its sheet resistance, the thickness of the electrically conductive layer 122 may be in a range of from about 50 nm to about 600 nm, in one embodiment.

In some embodiments, the method further includes interposing a buffer layer 124 (sometimes referred to in the art as a higher resistance transparent (HRT) layer) between the window layer 130 and the electrically conductive layer 122, as indicated in FIG. 5. In one embodiment, the thickness of the buffer layer 124 is in a range from about 50 nm to about 200 nm Non-limiting examples of suitable materials for the buffer layer 124 include tin dioxide ($SnO_2$), zinc tin oxide (ZTO), zinc-doped tin oxide ($SnO_2$:Zn), zinc oxide (ZnO), indium oxide ($In_2O_3$), or combinations thereof.

Figure 6:
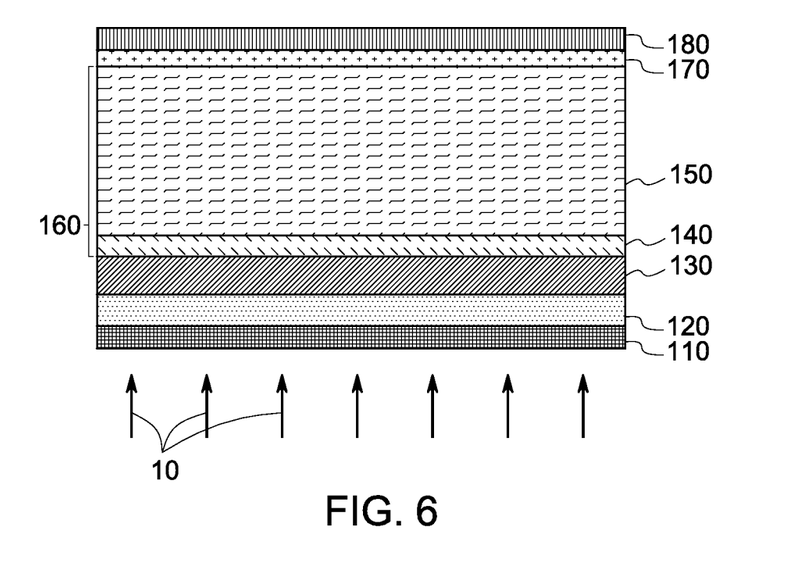
FIG. 6 is a schematic of a photovoltaic device, according to one embodiment of the invention.

As indicated in FIGS. 3-6, the transparent layer 120 is further disposed on a support 110. As illustrated in FIG. 6, in such embodiments, the solar radiation 10 enters from the support 110, and after passing through the transparent layer 120 and the window layer 130, enters the absorber layer 160, where the conversion of electromagnetic energy of incident light (for instance, sunlight) to electron-hole pairs (that is, to free electrical charge) occurs.

In one embodiment, the support 110 is transparent over the range of wavelengths for which transmission through the support 110 is desired. In one embodiment, the support 110 may be transparent to visible light having a wavelength in a range from about 400 nm to about 1000 nm. In some embodiments, the support 110 includes a material capable of withstanding heat treatment temperatures greater than about 600° C., such as, for example, silica or borosilicate glass. In some other embodiments, the support 110 includes a material that has a softening temperature lower than 600° C., such as, for example, soda-lime glass or a polyimide. In some embodiments certain other layers may be disposed between the transparent layer 120 and the support 110, such as, for example, an anti-reflective layer or a barrier layer (not shown).

Referring again to FIGS. 3-6, in some embodiments, the method includes disposing a transparent layer 120 including an electrically conductive layer 122 on a support 110 by any suitable technique, such as sputtering, chemical vapor deposition, spin coating, spray coating, or dip coating. Referring to FIG. 5, in some embodiments, an optional buffer layer 124 may be deposited on the electrically conductive layer 122 using sputtering to form the transparent layer 120. The n-type semiconductor layer or window layer 130 may be then deposited on the transparent layer 120. Non-limiting examples of the deposition methods for the n-type semiconductor layer 130 include one or more of close-space sublimation (CSS), vapor transport method (VTM), sputtering, and electrochemical bath deposition (CBD).

In some embodiments, as indicated in FIG. 6, the method further includes disposing a p+-type semiconductor layer 170 on the absorber layer 160. In some embodiments, the method further includes disposing a back contact layer 180 on the absorber layer 160.

The term "p+-type semiconductor layer" as used in this context refers to a semiconductor layer having an excess mobile p-type carrier or hole density compared to the p-type charge carrier or hole density in the absorber layer 160. In some embodiments, the p+-type semiconductor layer has a p-type carrier density in a range greater than about $1 \times 10^{16}$ per cubic centimeter. In particular embodiments, the p+-type semiconductor layer has a p-type carrier density in a range from about $1 \times 10^{17}$ per cubic centimeter to about $1 \times 10^{20}$ per cubic centimeter.

The p+-type semiconductor layer 170 may be used as an interface between the absorber layer 160 and the back contact layer 180, in some embodiments. Higher carrier densities of the p+-type semiconductor layer 170 may minimize the series resistance of the back contact layer, in comparison to other resistances within the device. In one embodiment, the p+-type semiconductor layer 170 has a thickness in a range from about 50 nm to about 200 nm.

In one embodiment, the p+-type semiconductor layer 170 includes a heavily doped p-type material selected from group consisting of amorphous Si:H, amorphous SiC:H, crystalline Si, microcrystalline Si:H, microcrystalline SiGe:H, amorphous SiGe:H, amorphous Ge, microcrystalline Ge, GaAs, BaCuSF, BaCuSeF, BaCuTeF, LaCuOS, LaCuOSe, LaCuOTe, LaSrCuOS, LaCuO $Se_{0.6}Te_{0.4}$, BiCuOSe, BiCaCuOSe, PrCuOSe, NdCuOS, $Sr_2Cu_2ZnO_2S_2$, $Sr_2CuGaO_3S$, $(Zn,Co,Ni)O_x$, and combinations thereof.

In another embodiment, the p+-type semiconductor layer 170 includes a heavily doped p+-doped material selected from the group consisting of zinc telluride, magnesium telluride, manganese telluride, beryllium telluride, mercury telluride, arsenic telluride, antimony telluride, copper telluride, and combinations thereof. In some embodiments, the p+-doped material further includes a dopant selected from the group consisting of copper, gold, nitrogen, phosphorus, antimony, arsenic, silver, bismuth, sulfur, sodium, and combinations thereof.

In one embodiment, the photovoltaic device 100 further includes a metal layer, sometimes referred to in the art as a back contact layer 180, as indicated in FIG. 6. In some embodiments, the metal layer 180 is disposed directly on the absorber layer 160 (not shown). In some other embodiments, the metal layer 180 is disposed on the p+-type semiconductor layer 170 disposed on the absorber layer 160, as indicated in FIG. 6. In some embodiments, the p+-type semiconductor layer 170 may provide for improved diffusion properties between the metal layer 180 and the absorber layer 160. Accordingly, in some embodiments, any suitable metal having the desired conductivity and reflectivity may be selected as the back contact layer 180. In one embodiment, the metal layer 180 includes gold, platinum, molybdenum, tungsten, tantalum, palladium, aluminum, chromium, nickel, or silver. In certain embodiments, another metal layer (not shown), for example, aluminum, may be disposed on the metal layer 180 to provide lateral conduction to the outside circuit.

Referring again to FIG. 6, a p+-type semiconducting layer 170 may be further disposed on the absorber layer 160 by depositing a p+-type material using any suitable technique, for example PECVD, in one embodiment. In an alternate embodiment, a p+-type semiconductor layer 170 may be disposed on the absorber layer 160 by chemically treating the absorber layer 160 to increase the carrier density on the back-side (side in contact with the metal layer and opposite to the window layer) of the absorber layer 160. In one embodiment, the photovoltaic device 100 may be completed by depositing a back contact layer, for example, a metal layer 180 on the p+-type semiconductor layer 170.

In some embodiments, a photovoltaic device 100 is provided. Referring to FIGS. 1-6, the photovoltaic device 100 includes a window layer 130 and an absorber layer 160 disposed on the window layer, wherein the absorber layer 160 includes a first region 140 disposed adjacent to the window layer 130, in some embodiments. The photovoltaic device further includes a second region 150 disposed on the first region 140 in some embodiments. As noted earlier, in certain embodiments, the photovoltaic device further includes a transition region 145 interposed between the first region 140 and the second region 150, as indicated in FIG. 9.

In some embodiments, the first region 140 includes oxygen at a first concentration and the second region 150 includes oxygen at a second concentration, as described earlier. In some embodiments, there is a step-change in concentration profile of oxygen from the first region 140 to the second region 150. The term "step-change" as used herein means that a ratio of concentration of oxygen in the first region 140 to the concentration of oxygen in the second region 150 is greater than about 10, in some embodiments. In some embodiments, a ratio of concentration of oxygen in the first region 140 to the concentration of oxygen in the second region 150 is greater than about 50, in some embodiments. In some embodiments, a ratio of concentration of oxygen in the first region 140 to the concentration of oxygen in the second region 150 is greater than about 100, in some embodiments. In particular embodiments, the second region 150 is substantially free of oxygen, wherein the term substantially free is defined earlier.

In some embodiments, the first concentration is substantially constant across a thickness of the first region 140. In alternate embodiments, the first concentration is compositionally graded across a thickness of the first region 140. In some embodiments, the second concentration is substantially constant across a thickness of the second region 150. In alternate embodiments, the second concentration is compositionally graded across a thickness of the second region 150. The term "substantially constant", as used in this context means that that the variation in the concentration of oxygen in the first region 140 or the second region 150 is less than about 10 percent across the thickness of the first region 140 or the second region 150, respectively.

Figure 7:
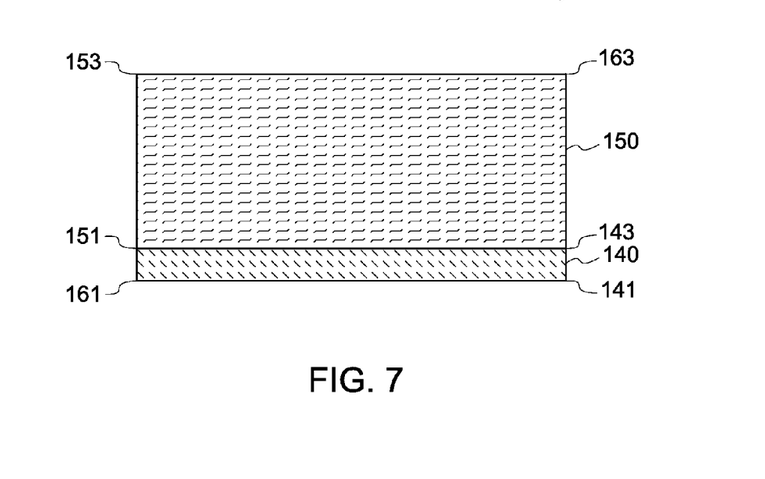
FIG. 7 is a schematic of an absorber layer, according to one embodiment of the invention.
Figure 8A:
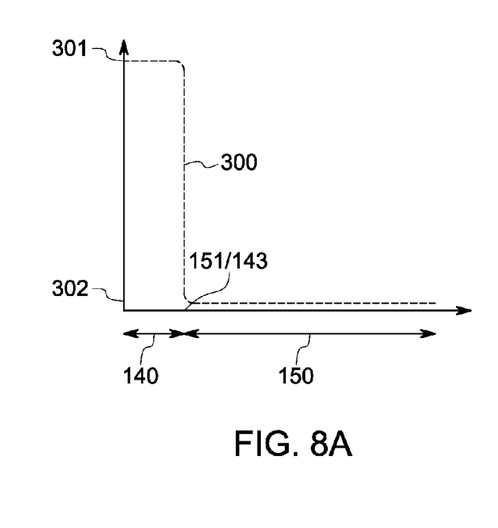
FIG. 8A is an illustration of concentration profile of oxygen in the absorber layer, according to an exemplary embodiment of the invention.

Referring to FIGS. 7 and 8A, a concentration profile 300 of oxygen in the absorber layer 160 is shown, according to one embodiment of the invention. As indicated, in FIG. 8A, the concentration of oxygen has a value 301 in the first region 140, which decreases to a value 302 in the second region 150. The step change from 301 to 302 occurs at the interface 151/143 between the first region 140 and the second region 150, in one embodiment. It should be noted that in some embodiments, the change between the concentration of oxygen in the first region 140 to the second region 150 at the interface 151/143 may be gradual and the concentration profile 300 may include a curve at the interface 151/143 (not shown).

Figure 8B:
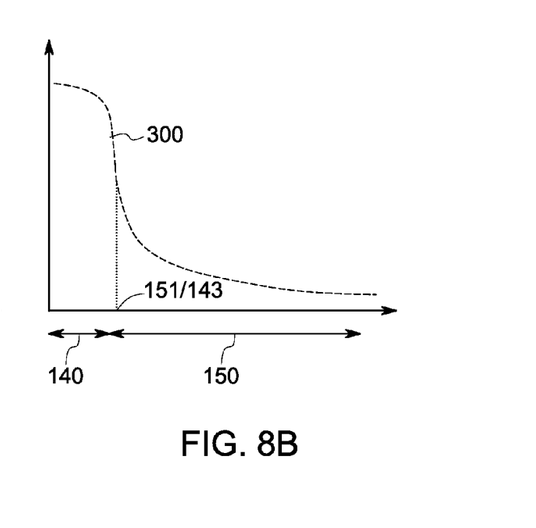
FIG. 8B is an illustration of concentration profile of oxygen in the absorber layer, according to an exemplary embodiment of the invention.

It should be further noted that in FIG. 8A, the concentration profile of oxygen has been illustrated as having a constant value in the first region 140 and the second region 150 as an exemplary embodiment only. In some embodiments, the concentration profile of oxygen in the first region 140 may vary across the thickness of the first region 140. For example, in one embodiment, the concentration of oxygen in the first region 140 may continuously decrease from the interface 141 in contact with the window layer 130 to the interface 143 in contact with the second region 150, as shown in FIG. 8B. In such embodiments, the value 301 may represent the average concentration of oxygen. In an alternate embodiment, the concentration of oxygen in the first region 140 may be substantially constant across the thickness of the first region 140, as indicated in FIG. 8A.

Further, in one embodiment, the concentration of oxygen in the second region 150 may continuously decrease from the interface 151 in contact with the first region 140 to the interface 153 in contact with the back contact layer 180, as shown in FIG. 8B. In an alternate embodiment, the concentration of oxygen in the second region 150 may be substantially constant across the thickness of the second region 150, as indicated in FIG. 8A.

EXAMPLES

Example 1

Preparation of Cadmium Telluride Photovoltaic Device having a CdTe Layer Deposited in the Presence of Controlled Oxygen Flow A cadmium telluride photovoltaic device was prepared by depositing a cadmium telluride (CdTe) layer over a cadmium sulfide (CdS) layer deposited on $SnO_2$:F (FTO) transparent conductive oxide (TCO) coated substrate. The substrate was 3 millimeters thick soda-lime glass, coated with a FTO transparent conductive layer (450 nm) and a thin high resistance transparent $ZnSnO_x$ (ZTO) layer (100 nm). Cadmium sulfide (CdS) layer was deposited on the ZTO layer in the presence of oxygen (CdS:O (5% O)) at a thickness of about 80 nm The CdTe layer was deposited using a close spaced sublimation process at a substrate temperature of about 550 degrees Celsius and a source temperature of about 625 degrees Celsius. During ramping of the substrate and source temperatures, the substrate temperature ramp rate was greater than the source temperature ramp rate. CdTe deposition began when the substrate temperature reached its set point and the source temperature exceeded the substrate temperature. Two samples using different deposition conditions for oxygen were prepared-Samples 1 and 2.

For preparation of Sample 1, oxygen was allowed to flow for 100 seconds at the beginning of the deposition step. This step resulted in the deposition of oxygen-containing first region 140 on the window layer 130. After 100 seconds, the oxygen was turned off and the remainder of the CdTe layer was deposited without oxygen while maintaining the same background pressure. 100 seconds was approximately the length of time required for the source temperature to reach its set point of 625 degrees Celsius. This step resulted in the deposition of second region 150 on the window layer 130.

For preparation of Sample 2, oxygen was allowed to flow for 130 seconds at the beginning of CdTe deposition step. This step resulted in the deposition of oxygen-containing first region 140 on the window layer 130. After 130 seconds the oxygen was turned off and the remainder of the CdTe layer was deposited without oxygen while maintaining the same background pressure. In this sample, the oxygen flow was continued for an additional 30 sec after the source temperature reached its set point. This step resulted in the deposition of second region 150 on the window layer 130.

The deposited cadmium telluride layer was further treated with cadmium chloride at a temperature of 400 degrees Celsius for about 20 minutes in air. At the end of the stipulated time, the CdTe layer was treated with a copper solution and subjected to annealing at a temperature of 200 degrees Celsius for duration of 18 minutes. Gold was then deposited on the copper treated layer as the back contact by evaporation process to complete the device fabrication process.

Comparative Example 1

Preparation of the Cadmium Telluride Photovoltaic Device having a CdTe Layer Deposited with Continuous Oxygen Flow A photovoltaic device was prepared similar to the photovoltaic devices in Samples 1 and 2 except the CdTe layer was deposited with oxygen flowing continuously throughout the CdTe growth process.

Comparative Example 2

Preparation of the Cadmium Telluride Photovoltaic Device having a CdTe Layer Deposited in the Absence of Oxygen Flow A photovoltaic device was prepared similar to the photovoltaic device in Samples 1 and 2 except the CdTe layer was deposited without oxygen flowing through the growth process.

Table 1 shows the average (Avg) efficiency, open-circuit voltage ($V_{oc}$), short-circuit current density ($J_{Sc}$), and fill factor (FF) values for Samples 1 and 2 compared to Comparative Samples 1 and 2 and standard deviation (StDev) associated with these values.

TABLE 1

Performance parameters for CdTe photovoltaic devices

| Sample | Efficiency (%) | | $V_{OC}$ (mV) | | $J_{SC}$ (mA/cm$^2$) | | FF (%) | |
|---|---|---|---|---|---|---|---|---|
| | Avg | StDev | Avg | StDev | Avg | StDev | Avg | StDev |
| Sample 1 | 13.5 | 0.3 | 828 | 2 | 21.5 | 0.4 | 76.0 | 0.6 |
| Sample 2 | 13.9 | 0.2 | 827 | 2 | 22.1 | 0.4 | 75.8 | 0.4 |
| Comparative Example 1 | 13.2 | 0.3 | 815 | 4 | 22.4 | 0.3 | 72.4 | 1.0 |
| Comparative Example 2 | 12.9 | 0.3 | 804 | 6 | 21.5 | 0.4 | 74.5 | 3.9 |

It may be noted from Table 1 that the devices with the CdTe layer deposited using controlled oxygen flow (Samples 1 and 2) displayed an increase in the FF and Voc when compared with the performance parameters of devices having CdTe layer deposited using continuous oxygen flow (Comparative Example 1). Further, devices with the CdTe layer deposited using controlled oxygen flow displayed an increase in the FF and Voc when compared with the performance parameters of devices having CdTe layer deposited in the absence of oxygen flow. The devices in Samples 1 and 2 displayed higher $V_{oc}$ and FF, contributing to a higher efficiency.

The appended claims are intended to claim the invention as broadly as it has been conceived and the examples herein presented are illustrative of selected embodiments from a manifold of all possible embodiments. Accordingly, it is the Applicants' intention that the appended claims are not to be limited by the choice of examples utilized to illustrate features of the present invention. As used in the claims, the word "comprises" and its grammatical variants logically also subtend and include phrases of varying and differing extent such as for example, but not limited thereto, "consisting essentially of" and "consisting of." Where necessary, ranges have been supplied; those ranges are inclusive of all sub-ranges there between. It is to be expected that variations in these ranges will suggest themselves to a practitioner having ordinary skill in the art and where not already dedicated to the public, those variations should where possible be construed to be covered by the appended claims. It is also anticipated that advances in science and technology will make equivalents and substitutions possible that are not now contemplated by reason of the imprecision of language and these variations should also be construed where possible to be covered by the appended claims.

The invention claimed is:

1. A photovoltaic device, comprising:
   a window layer; and
   an absorber layer disposed on the window layer, wherein the absorber layer comprises:
      a first region disposed adjacent to the window layer, the first region having a thickness from about 100 nm to about 1500 nm and comprising oxygen at a first concentration, wherein the first concentration is substantially constant across the thickness of the first region; and
      a second region in direct contact with the first region, the second region having a thickness and comprising oxygen at a second concentration, wherein a ratio of the first concentration to the second concentration is greater than about 10.

2. The photovoltaic device of claim 1, wherein a ratio of the first concentration to the second concentration is greater than about 100.

3. The photovoltaic device of claim 1, wherein the first concentration is in a range from about $1 \times 10^{18}$ cm$^{-3}$ to about $1 \times 10^{20}$ cm$^{-3}$.

4. The photovoltaic device of claim 1, wherein the second concentration is in a range from about $1 \times 10^{15}$ cm$^{-3}$ to about $1 \times 10^{18}$ cm$^{-3}$.

5. The photovoltaic device of claim 1, wherein the second concentration is substantially constant across the thickness of the second region.

6. The photovoltaic device of claim 1, wherein the second region is substantially free of oxygen.

7. The photovoltaic device of claim 1, wherein the thickness of the first region is from about 100 nanometers to about 1000 nanometers.

8. The photovoltaic device of claim 1, wherein the thickness of the second region is from about 500 nanometers to about 3000 nanometers.

9. The photovoltaic device of claim 8, wherein the thickness of the second region is from about 750 nanometers to about 3000 nanometers.

10. The photovoltaic device of claim 1, wherein the thickness of the first region is less than the thickness of the second region.

11. The photovoltaic device of claim 6, wherein the second concentration is less than about $1 \times 10^{16}$ cm$^{-3}$.

12. A photovoltaic device, comprising:
   a window layer; and
   an absorber layer disposed on the window layer, wherein the absorber layer consists of:
      a first region disposed adjacent to the window layer, the first region having a thickness from about 100 nm to about 1500 nm and comprising oxygen at a first concentration, wherein the first concentration is substantially constant across the thickness of the first region, and
      a second region disposed adjacent to the first region, the second region having a thickness and comprising oxygen at a second concentration, wherein a ratio of the first concentration to the second concentration is greater than about 10.

13. The photovoltaic device of claim 11, wherein the second concentration is less than about $1 \times 10^{15}$ cm$^{-3}$.

14. The photovoltaic device of claim 1, wherein the first region is an interfacial region and the second region is a thicker bulk region.

\* \* \* \* \*